United States Patent
Dirscherl et al.

(10) Patent No.: US 10,886,426 B2
(45) Date of Patent: Jan. 5, 2021

(54) METHOD FOR PRODUCING AN ELECTRONIC DEVICE AND ELECTRONIC DEVICE

(71) Applicant: OSRAM Opto Semiconductors GmbH, Regensburg (DE)

(72) Inventors: Georg Dirscherl, Regensburg (DE); Siegfried Herrmann, Neukirchen (DE)

(73) Assignee: OSRAM OLED GMBH, Regensburg (DE)

( * ) Notice: Subject to any disclaimer, the term of this patent is extended or adjusted under 35 U.S.C. 154(b) by 114 days.

(21) Appl. No.: 16/087,646

(22) PCT Filed: Mar. 22, 2017

(86) PCT No.: PCT/EP2017/056814
§ 371 (c)(1),
(2) Date: Sep. 23, 2018

(87) PCT Pub. No.: WO2017/162734
PCT Pub. Date: Sep. 28, 2017

(65) Prior Publication Data
US 2020/0152822 A1    May 14, 2020

(30) Foreign Application Priority Data
Mar. 23, 2016   (DE) .................. 10 2016 105 407

(51) Int. Cl.
*H01L 33/00* (2010.01)
*H01L 23/00* (2006.01)
*H01L 33/56* (2010.01)

(52) U.S. Cl.
CPC ............ *H01L 33/005* (2013.01); *H01L 24/96* (2013.01); *H01L 33/56* (2013.01); *H01L 2933/005* (2013.01); *H01L 2933/0033* (2013.01)

(58) Field of Classification Search
None
See application file for complete search history.

(56) References Cited

U.S. PATENT DOCUMENTS

| | | | |
|---|---|---|---|
| 7,391,046 B2 | 6/2008 | Tsutsumi et al. |
| 8,729,714 B1 | 5/2014 | Meyer |
| 2010/0022040 A1 | 1/2010 | Konishi et al. |
| 2014/0175487 A1 | 6/2014 | Zhang |
| 2016/0064631 A1 | 3/2016 | Shatalov et al. |

(Continued)

FOREIGN PATENT DOCUMENTS

| | | |
|---|---|---|
| DE | 102005013785 A1 | 11/2005 |
| DE | 102013113469 A1 | 7/2014 |

(Continued)

*Primary Examiner* — Michelle Mandala
(74) *Attorney, Agent, or Firm* — Slater Matsil, LLP

(57) ABSTRACT

A method for producing an electronic device and an electronic device are disclosed. In an embodiment a method for producing an electronic device includes attaching semiconductor chips on a carrier, applying a fluoropolymer to main surfaces of the semiconductor chips facing away from the carrier and a main surface of the carrier facing the semiconductor chip thereby forming an encapsulation layer including a fluoropolymer, structuring the encapsulation layer thereby forming cavities in the encapsulation layer and applying a metal layer in the cavities.

17 Claims, 5 Drawing Sheets

(56) References Cited

U.S. PATENT DOCUMENTS

2016/0111616 A1* 4/2016 Margalit ................ H01L 33/62
                                                            257/98
2016/0197232 A1* 7/2016 Bour ...................... H01L 33/44
                                                            257/13
2017/0352785 A1* 12/2017 Lee ......................... H01L 33/36

FOREIGN PATENT DOCUMENTS

DE      102015101598 A1    8/2016
WO       2009026284 A2     2/2009

* cited by examiner

FIG 11

| | A | B | B [%] | T °C |
|---|---|---|---|---|
| PTFE | $-[CF_2-CF_2]-$ | ~ | ~ | 327 |
| MFA | $-[CF_2-CF_2]-$ | $-[CF_2-CF(OR)]-$, R=CF$_3$ | 3-4 | 285 |
| PFA-1 | $-[CF_2-CF_2]-$ | $-[CF_2-CF(OR)]-$, R=CF$_2$CF$_2$CF$_3$ | 1.5-2 | 305 |
| FEP-1 | $-[CF_2-CF_2]-$ | $-[CF_2-CF(R)]-$, R=CF$_3$ | 7-7.5 | 265 |
| ECTFE | $-[CF(Cl)-CF_2]-$ | $-[CH_2-CH_2]-$ | 50 | 240 |
| PDVDF | $-[CF_2-CF_2]-$ | - | - | 175 |
| ETFE | $-[CF_2-CF_2]-$ | $-[CH_2-CH_2]-$ | 50 | 265 |
| PCTFE | $-[CF(Cl)-CF_2]-$ | - | - | 210 |

METHOD FOR PRODUCING AN ELECTRONIC DEVICE AND ELECTRONIC DEVICE

This patent application is a national phase filing under section 371 of PCT/EP2017/056814, filed Mar. 22, 2017, which claims the priority of German patent application 10 2016 105 407.0, filed Mar. 23, 2016, each of which is incorporated herein by reference in its entirety.

TECHNICAL FIELD

The invention relates to a method for producing an electronic device and an electronic device.

SUMMARY OF THE INVENTION

Embodiments of the invention provide a method for producing an electronic device, in particular a radiation-emitting optoelectronic device, and an electronic device, which is characterized by a high stability, a high efficiency and a long service life.

In an embodiment a method for producing an electronic device is specified. The method comprises the following method steps: B) applying and attaching semiconductor chips on a carrier, D) applying a fluoropolymer to the main surface of the semiconductor chips facing away from the carrier and the main surface of the carrier facing the semiconductor chips to form an encapsulation layer comprising a fluoropolymer, E) structuring the encapsulation layer comprising the fluoropolymer to form cavities in the encapsulation layer, G) applying a metal layer in the cavities.

The above-mentioned method steps and the method steps described below are preferably carried out in the order indicated. In this case, it is possible that between individual method steps further method steps that are not listed are carried out or that the specified method steps are carried out exactly in the specified sequence without intermediate steps.

In particular, the semiconductor chips in method step B) are applied and fixed on the carrier at a distance from one another. In method step D), the fluoropolymer is preferably applied so that the interspace between the semiconductor chips are filled with the fluoropolymer. In particular, the main surfaces of the semiconductor chips facing away from the carrier and the side surfaces of the semiconductor chips are completely covered with the fluoropolymer or the encapsulation layer.

According to an embodiment, the method produces a radiation-emitting optoelectronic device, preferably a light-emitting diode (LED).

According to at least one embodiment, the semiconductor chips are designed to emit a primary radiation in the UV range of the electromagnetic spectrum during operation of the device.

Here and in the following UV range of the electromagnetic spectrum refers to the wavelength range between 200 nm and 380 nm. The wavelength range between 315 and 380 nm is called UVA radiation, the wavelength range between 280 and 315 nm as UVB radiation and the wavelength range between 200 and 280 nm is called UVC radiation. In particular, during operation of the device, the semiconductor chip emits a primary radiation in the UVB or UVC range.

In one embodiment, the semiconductor chips comprise an active epitaxial layer sequence that is suitable for emitting a primary radiation in the UV range of the electromagnetic spectrum during operation of the radiation-emitting optoelectronic device. It is possible that the semiconductor chip comprises a sapphire substrate or has grown on a sapphire substrate. Further possible substrates are PCB, MCB or carrier with lead frames. PCB stands for a printed circuit board and MCB for a metal core board.

To generate the primary radiation, the epitaxial layer sequence may, for example, have a pn junction, a double heterostructure, a single quantum well or, more preferably, a multiple quantum well structure. The term quantum well structure does not contain any information about the dimensionality. It thus includes, among other things, quantum wells, quantum wires, quantum dots, and any combination of these structures.

A semiconductor chip which is suitable for emitting UV primary radiation with a peak wavelength between 200 and 380 nm during operation is based, for example, on AlInGaN or ZnO. For example, the semiconductor chips are based on $In_xAl_yGa_{1-x-y}N$ with $0 \leq x \leq 1$, $0 \leq y \leq 1$ and $x+y \leq 1$.

The wavelength can be shifted within the preferred range for the particular application by the composition, for example, the ratio of indium to gallium in AlInGaN.

In one embodiment, the semiconductor chips are soldered or glued onto the carrier in method step B). As an adhesive can be used, for example, an adhesive filled with silver or gold, for example, an acrylic or epoxy adhesive.

According to one embodiment, the primary radiation emitted by the semiconductor chips is emitted to the outside via the main surface of the semiconductor chips facing away from the carrier and thus via the encapsulation layer. The main surface of the semiconductor chips facing away from the carrier can also be called the main radiation exit surface. Thus, the encapsulation layer is subject to high demands on the transparency and light transmittance not only for visible light, but in particular also for the ultraviolet primary radiation.

The encapsulation layer, which comprises a fluoropolymer, in particular an organic fluoropolymer, is particularly durable. It also allows a comparatively constant radiation emission over a long period of operation, since they are much less prone to yellowing than conventional polymers, such as silicones or epoxies. Due to the high stability, in particular to UV radiation, no further additives need to be used for stabilization, which in turn would represent an additional risk of yellowing.

By fluoropolymer are meant in particular organic fluoropolymers containing carbon-fluorine bonds, as well as a backbone containing carbon-carbon bonds.

Organic fluoropolymers have an extremely strong CF bond (460 kJ/mol). The fluoro groups also shield the polymer backbone, which has CC bonds, from the outside. For this reason, fluoropolymers are suitable for long-term use temperatures of about 260° C. This is well above temperatures of about 150° C., as they can occur in radiation-emitting optoelectronic devices, for example, in LEDs. In addition, fluoropolymers are also resistant to a wide range of chemicals such as acids and alkalis and have low flammability (without the addition of additives). In addition, there is a very high transparency and radiation permeability even against short-wave UV radiation, especially against high-energy UVB and UVC radiation.

Fluoropolymers have high stability in a broad spectral range against UV radiation. They even withstand long-term exposure to UV radiation, in particular also to high-energy UVB and UVC radiation. This high long-term stability with respect to short-wave radiation is surprisingly also given for fluoropolymers which have a high transmission with respect to UV radiation and visible light. In such fluoropolymers with high transmittance to short-wave radiation and visible light, the radiation is not already reflected or absorbed by the outer layers of the polymer material.

Radiation-permeable fluoropolymers are surprisingly also suitable for encapsulation layers of radiation-emitting optoelectronic devices, even at high temperatures in the simultaneous presence of short-wave UV radiation due to their stability, but in particular their constant radiation permeability. They are stable and radiolucent even in the area of the greatest radiation exposure, the area of the main radiation exit surface or the main radiation exit surface and the side surfaces of the semiconductor chips over long operating times.

In addition, encapsulation layers, comprising fluoropolymers, provide good protection of the semiconductor chip against environmental influences such as corrosive gases, oxygen, moisture, and against chemical influences such as acids and bases, which can be used, for example, for further processing steps. Encapsulation layers comprising fluoropolymers are therefore much less permeable to such influences than, for example, silicones.

According to one embodiment, in addition to the fluoropolymer, the encapsulation layer comprises a wavelength conversion substance, for example, a phosphor, which at least partially converts the primary radiation emitted by the semiconductor chips into a longer-wave secondary radiation. The radiation-emitting optoelectronic device can then emit, for example, white light to the outside to the environment during operation.

The transmission for UV radiation is for fluoropolymers significantly higher than with conventional polymers. Conventional polymers generally have an absorption edge at about 350-400 nm, this means, at wavelengths less than 350 nm no significant transmission takes place. Fluoropolymers, as used in the case of embodiments of the invention, often have a transmission between 50% and 90%, even at wavelengths in the range from 200 nm to 300 nm, in contrast to conventional polymers.

According to one embodiment, the fluoropolymer has a first repeating structural unit A of the following general formula:

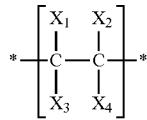

wherein the substituents $X_1$ to $X_4$ are each independently selected from the group comprising hydrogen, Halogen, in particular chlorine and fluorine, R, or OR, where the residue R is a hydrocarbon residue $C_1$-$C_{10}$ or a fluorinated hydrocarbon residue may be $C_1$-$C_{10}$, and wherein at least one of the substituents $X_1$ to $X_4$ is fluorine.

Here, and in the following, the symbol "*" stands for binding sites of the repeating structural unit, which are connected to the next repeating structural unit. In addition, at the end of the polymer chain, end groups may terminate the polymer, which may for example be selected from the same group of substituents as substituents $X_1$ to $X_4$. But there are also other common end groups conceivable.

The inventors have recognized that polymers with said repeating structural unit A are particularly well suited for encapsulation layers of radiation-emitting optoelectronic devices.

In particular, it is preferred if at least two of the residues $X_1$-$X_4$ are fluorine atoms. It is even more preferred if at least three or exactly three of the residues $X_1$-$X_4$ are fluorine atoms. In another particularly preferred embodiment, four of the residues are fluorine atoms. Overall, the stability increases with increasing number of fluorine atoms.

R may be a hydrocarbon residue $C_1$-$C_{10}$, which is preferred when R is a hydrocarbon residue $C_1$-$C_5$, in particular $C_1$-$C_3$. The hydrocarbon residue may be, for example, saturated, unsaturated, normal, branched or cyclic hydrocarbon residues, in particular alkyl residues. But also aromatic residues are conceivable. R can be unsubstituted or substituted.

Particularly preferred is when R is a fluorinated hydrocarbon residue $C_1$-$C_{10}$, for example, a fluorinated hydrocarbon residue having up to five ($C_1$-$C_5$) or more preferably having up to three carbon atoms ($C_1$-$C_3$). For example, R can have the general formula $-C_nF_{2n+1}$ with n less than or equal to 10, preferably n less than or equal to 5, or with n less than or equal to 3. For example, the residue R can be a $CF_3$ group, a $C_2F_5$ group or a $C_3F_7$ group. But not completely fluorinated groups or longer chains are conceivable. The higher the degree of fluorination, the more stable the fluoropolymer in general.

It is generally preferred when R is a perfluorinated hydrocarbon residue. The introduction of a residue R or OR for at least one or exactly one of the substituents $X_1$ to $X_4$ leads to a better processability of the fluoropolymer, in particular the fluoropolymer is thereby better castable. This opens up processing through a variety of thermoplastic processes and is thus crucial for the use of fluoropolymers as in encapsulation layers. Processing by means of casting, injection molding, film or tube extrusion are just a few examples of possible processing techniques. Such fluoropolymers thus have advantages over conventional fluoropolymers in processing and in particular enable large-scale production.

In a preferred embodiment, A is a repeating structural unit selected from the group of repeating structural units of the following general formulas:

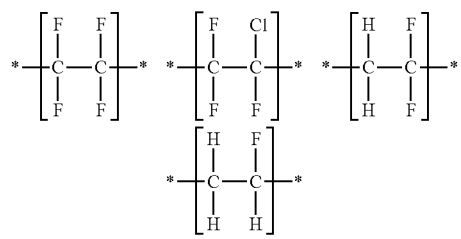

In a particularly preferred embodiment, the fluoropolymer is a fluoropolymer suitable for injection molding. Particularly preferred are meltable fluorine-containing thermoplastics as fluoropolymers. These polymers are easy to process by injection molding or extrusion.

In another embodiment, the fluoropolymer is injection-moldable modified polytetrafluoroethylene (PTFE). Conventional PTFE is not suitable for injection molding. Although PTFE changes to a thermoplastic state upon heating, but is not sufficiently fluid after melting of the crystalline regions and therefore cannot be processed thermoplastic. An example of a thermoplastic, injection-moldable, modified PTFE-based fluoropolymer is the fluoropolymer brand name Moldflon® from Elring Klinger.

In another particularly preferred embodiment of the invention, the fluoropolymer is a copolymer which, in addition to the first structural unit A, comprises at least one further structural unit B, which is different from the first structural unit A, of the general formula

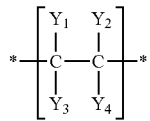

wherein the substituents $Y_1$ to $Y_4$ are each independently selected from the group comprising hydrogen, halogens, in particular chlorine and fluorine, R, or OR, wherein the residue R may each be a hydrocarbon residue or a fluorinated hydrocarbon residue $C_1$-$C_{10}$ or wherein the structural unit B can have the formula

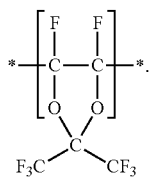

The inventors have found that copolymers of the described form with two different repeating structural units A and B are particularly well suited for encapsulation layers for radiation-emitting optoelectronic devices according to embodiments of the invention. The use of copolymers of the described form makes it possible to obtain fluoropolymers which are particularly suitable for casting. The diversity of structural units A and B makes it possible to flexibly adjust the properties of the copolymer and, for example, to optimize the castability or to adjust other properties of the polymer (for example flexibility, chemical resistance, temperature resistance, fire resistance, mechanical strength, processability at low temperatures, optical properties).

Radiation-emitting optoelectronic devices of the described form can be manufactured with a particularly low effort and can therefore be produced cost-effectively. At the same time they are characterized by a high transmission compared to a broad radiation spectrum, for example, also in the UV range, which has persisted even during continuous operation despite the radiation exposure and high temperatures.

In particular, in the case that at least one or exactly one of the four substituents $Y_1$ to $Y_4$ is a group R or a group OR, the castability of the polymer is considerably improved.

For R, in principle, the same residues are conceivable, as already described for the structural unit A. The effects for certain residues R listed in connection with the structural unit A are also applicable with regard to the structural unit B. It is again particularly preferred in this case if R is a fluorinated or even perfluorinated hydrocarbon residues, for example, with the general formula $-C_nF_{2n+1}$, where n is less than or equal to 10, preferably n is less than or equal to 5, or n is less than or equal to 3. For example, R can be equal to $-CF_3$, $-C_2F_5$ or $C_3F_7$.

In a further embodiment of the radiation-emitting optoelectronic device according to embodiments of the invention, the fluoropolymer is a copolymer having a first structural unit A and a second structural unit B, wherein the structural unit A is selected from the group comprising:

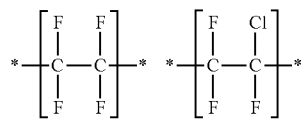

and wherein the structural unit B is selected from the group comprising:

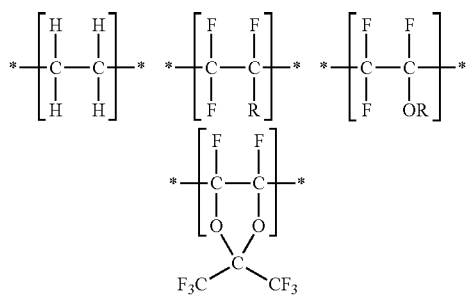

wherein each R can be a hydrocarbon residue $C_1$-$C_{10}$ or a fluorinated hydrocarbon residues $C_1$-$C_{10}$.

In turn, R may in each case comprise the residues already described above.

Copolymers of the described form are not only UV-stable, thermally stable, chemically resistant and at the same time sustainably permeable to UV radiation, but at the same time they are also characterized by their good castability and processability and thus making it possible to produce radiation-emitting optoelectronic devices that are particularly easy to manufacture and cost-effective.

Particularly preferred is an embodiment in which the radiation permeability element has a copolymer which comprises as structural unit A an unit of the formula

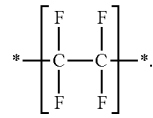

Copolymers with this structural unit A are particularly stable and radiolucent.

In one embodiment, the polymer is a block copolymer.

In a further embodiment of the invention, the fluoropolymer is a copolymer which is a random copolymer. This means that the structural units A and B are statistically distributed.

In one embodiment of the invention, the copolymer is a periodic copolymer in which the structural units A and B are present in a repeating regular order (for example . . . -AAAA-B-AAAA-B-AAAA- . . . et cetera).

In a further and at the same time particularly preferred embodiment, the copolymer has an alternating sequence of the structural units A and B (for example . . . -A-B-A-B-A-B- . . . ).

In particular, alternating copolymers are characterized by a particularly good combination of good UV radiation permeability, stability and processability.

In a further embodiment of the invention, the fluoropolymer has a further structural unit C which is different from structural units A and B, and can be described with the same general formula as structural unit B.

A preferred embodiment of the invention utilizes as encapsulation layer, an encapsulation layer comprising a fluoropolymer, which is a Ethylene-chlorotrifluoroethylene copolymer (ECTFE),
Ethylene tetrafluoroethylene copolymer (ETFE),
Perfluoroalkoxy polymers (PFA),
Fluorinated ethylene-propylene copolymer (FEP),
Polyvinyl fluoride (PVF),
Polychlorotrifluoroethylene (PCTFE),
Copolymer of tetrafluoroethylene, hexafluoropropylene and vinylidene fluoride (THV), or
Copolymer of tetrafluoroethylene and 2,2-bis(trifluoromethyl)-4,5-difluoro-1,3-dioxolane (PTFE-AF).

The encapsulation layer can also contain mixtures of the stated polymers or consist of one or more of the stated polymers. In addition, it is possible that the encapsulation layer contains modified forms of stated polymers.

Particularly suitable for an encapsulation layer for radiation-emitting optoelectronic devices according to embodiments of the invention are encapsulation layers comprising the polymer ECTFE. ECTFE is a fluoropolymer obtained by copolymerization of chlorotrifluoroethylene and ethylene. It thus has as structural unit A

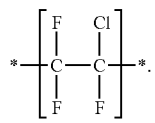

As structural unit B, it shows

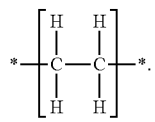

The structural units can be present, for example, in alternating sequence.

Particularly suitable for an encapsulation layer for radiation-emitting optoelectronic devices according to embodiments of the invention are also radiation-permeable elements comprising the polymer ETFE, which is a copolymer of tetrafluoroethylene and ethylene. The polymer has as structural unit A:

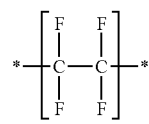

The structural unit B is ETFE

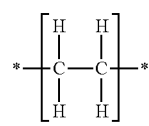

ETFE has a particularly high UV radiation permeability and also has high temperature resistance, good chemical resistance and high mechanical strength. The structural units can be present, for example, in alternating sequence.

Also preferred are radiation-emitting optoelectronic devices, wherein the radiolucent element comprises PFA or similar polymers. It is particularly preferred in this case if the structural unit has A

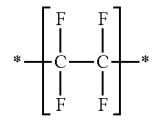

and the structural unit has B

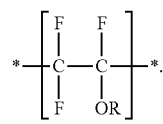

R is defined as already described for the general formula of the structural units A and B, preferably $CF_2CF_2CF_3$ or $CF_3$. It can be a random copolymer. The proportion of the structural unit B in the polymer may be 1 to 10 mol %. If $R=CF_2CF_2CF_3$, the proportion of the structural unit is preferably 1.5 to 2 mol %. If $R=CF_3$, the proportion of the structural unit is preferably 1.5 to 2 mol %. If $R=CF_2CF_2CF_3$, the fluoropolymer may be referred to PFA-1. If $R=CF_3$, the fluoropolymer can be referred to MFA. MFA can be processed by melting and, due to the full fluorination, is particularly suitable for encapsulation layers.

PFA has good chemical resistance, thermal resistance and high fire resistance.

For example, a corresponding polymer can be prepared by copolymerization of tetrafluoroethylene and perfluorovinylpropylether. PFA-based polymers contain a fluorinated alkoxy substituent that increases the formability of the polymer. The oxygen functionality also improves the transparency of the material, for example, the permeability of UV radiation, as desired for casting materials.

PFA-based fluoropolymers with particularly good processability are, for example, the fluoropolymers marketed under the brand name "Hyflon® PFA" by the company Solvay. Many comparable properties are also exhibited by other fluoropolymers sold under the brand name "Hyflon®" (for example "Hyflon® MFA"). PFA-based fluoropolymers are permanently stable at temperatures above 250° C.

Instead of introducing an alkoxy substituent, it is also possible to increase the ductility and hence the castability of corresponding polymers by introducing an alkyl substituent, in particular a fluorinated alkyl substituent. This is done, for example, with FEP, which is a copolymer of tetrafluoroethylene and a different monomer unit based on an at least partially fluorinated olefin (for example, hexafluoropropylene). FEP polymers have as structural unit A:

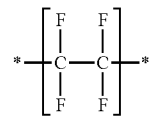

The structural unit B is:

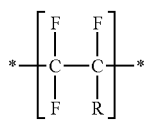

R is in turn defined as already described for the general formula of the structural units A and B, for example, CF$_3$. It can be a random copolymer. The proportion of the structural unit B in the polymer can be from 1 to 15 mol %, preferably from 7.0 to 7.5 mol %. If R=CF$_3$, the polymer may be referred to FEP-1. FEP-1 can be processed by melting and due to the full fluorination it is particularly suitable for encapsulation layers.

FEP polymers have a particularly good UV radiation permeability, chemical and thermal resistance and high fire resistance. They also allow particularly smooth surfaces.

Also suitable as fluoropolymer in a radiation-emitting device according to embodiments of the invention is polyvinyl fluoride (PVF), which has a repeating structural unit A

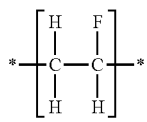

Also suitable as fluoropolymer is polychlorotrifluoroethylene (PCTFE) having as repeating structural unit A.

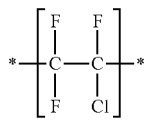

In addition, the polymer THV is also particularly suitable as a fluoropolymer in radiation-emitting optoelectronic devices. THV stands for the copolymer formed by copolymerization of tetrafluoroethylene, hexafluoropropylene and vinylidene fluoride. It has, as structural unit A

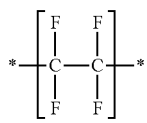

as structural unit B

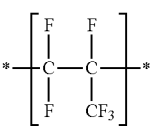

and as a third of these different repeating structural unit C

THV is thus a copolymer comprising three different repeating structural units. It has particularly advantageous optical properties, high flexibility and is very easy to process even at low temperatures. In particular, the good processability even at low temperatures of the THV is a particular advantage over many conventional fluoropolymers when used in the radiation-emitting optoelectronic devices according to embodiments of the invention.

PTFE-AF, a copolymer of tetrafluoroethylene and 2,2-bis (trifluoromethyl)-4,5-difluoro-1,3-dioxolane, is also particularly suitable as a fluoropolymer in radiation-emitting optoelectronic devices according to embodiments of the invention. PTFE-AF has a repeating structural unit A

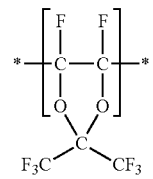

As a further repeating structural unit B, PTFE-AF also has

Also PTFE-AF shows particularly good UV radiation permeability and processability.

The polymers listed are examples of particularly suitable fluoropolymers, each of which is a fluorine-containing thermoplastic. Meltable fluorine-containing thermoplastics can be produced by means of injection molding and extrusion, making them particularly suitable for use in large-scale industrial processes. The fluoropolymers mentioned are common commercially available polymers and are thus easily available. Modified forms of the listed polymers can also be used in embodiments of the invention. As the example of PFA will show, there are often a large number of modifications of the respective polymers. Thus, PFA has commercially available modifications "PFA N" with improved adhesion properties, "PFA FLEX" with increased ductility and "PFA UHP" has a particularly high purity. Also PFA FLEX and PFA UHP each show improved transmission and a lower "crack susceptibility" (that is to say a lower tendency to form undesirable cracks or gaps) and are therefore particularly suitable for encapsulation layers. In addition, encapsulation layers comprising the polymers mentioned generally have a significantly lower tendency to yellow than conventional polymers.

In a further embodiment, the average molecular mass of the fluoropolymers of the radiolucent element of the radiation-emitting optoelectronic device according to the invention range from moo g/mol to 10000000 g/mol, in particular between 1000 g/mol and 1000000 g/mol, more preferably between 2000 g/mol and 800000 g/mol and most preferably between 4000 g/mol and 500000 g/mol.

Fluoropolymers are disclosed in the patent application DE 102015101598.6. The fluoropolymers disclosed in this patent application are hereby expressly incorporated in full by reference.

However, it is also possible with the method according to embodiments of the invention to use conventional fluoropolymers which, due to their hardness and brittleness, cannot be processed by means of a casting process and for these reasons have not yet been used for encapsulation layers in electronic devices. This is inventively possible because the corresponding fluoropolymer is first processed into a film. The film comprising or consisting of the fluoropolymer can be applied in method step D).

In addition, the polymer PTFE is particularly suitable as a fluoropolymer in electronic devices according to the embodiments of invention, which has the following structural unit A as the repeating structural unit A:

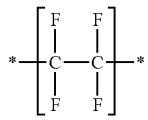

PTFE also shows particularly good UV radiation permeability and temperature resistance and can be applied, for example, as a film in method step D).

In one embodiment, the encapsulation layer may comprise the polymer PVDF, which has as structural unit A the following structural unit:

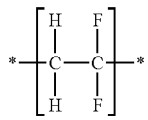

PVDF also shows particularly good UV radiation permeability and temperature resistance and can be applied, for example, as a film in method step D).

A particularly preferred embodiment of the present invention uses as an encapsulation layer, an encapsulation layer comprising a fluoropolymer, which is a
Ethylene chlorotrifluoroethylene copolymer (ECTFE),
Ethylene tetrafluoroethylene copolymer (ETFE),
Perfluoroalkoxy polymers (PFA),
Fluorinated ethylene-propylene copolymer (FEP)
Polychlorotrifluoroethylene (PCTFE),
Polytetrafluoroethylene (PTFE), or
Polyvinylidene fluoride (PVDF).

In a particularly preferred embodiment, the encapsulation layer comprises one of the following fluoropolymers: FEP-1 polymer with one structural unit A:

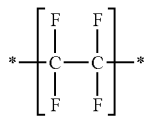

and a structural unit B:

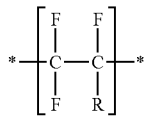

and with $R=CF_3$ or a PFA-1 polymer having a structural unit A:

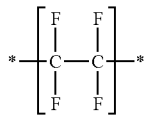

and a structural unit B

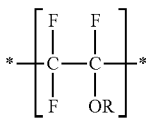

and with $R=CF_2CF_2CF_3$ or a MFA polymer having a structural unit A:

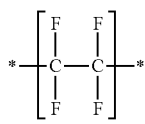

and a structural unit B

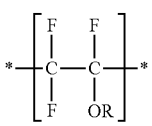

and with $R=CF_3$.

According to one embodiment, a film comprising a fluoropolymer is applied in method step D). In particular, the application is carried out by means of hot stamping or lamination. The film may have a layer thickness of between 50 μm and 400 μm, preferably between 50 μm and 200 μm, particularly preferably between 50 μm and 100 μm.

Usually fluoropolymers are not applicable due to their hardness and brittleness. By means of the method according to embodiments of the invention, that is to say for example the application of a film comprising the fluoropolymer, makes it possible to introduce fluoropolymers into encapsulation layers for electronic devices, in particular optoelectronic devices.

According to one embodiment, the fluoropolymer is applied and/or fixed in method step D) by injection molding, injection compression molding, transfer molding, hot stamping or welding. In particular, fluoropolymers are used for this, which are characterized by good castability and processability.

According to one embodiment, the fluoropolymers or the encapsulation layer have a refractive index of about 1.5.

Compared to a direct coupling out of the primary radiation of the semiconductor chips to air with a refractive index of about 1, the loss of radiation due to total reflection at the interface semiconductor chip/encapsulation layer can be reduced in comparison to semiconductor chip/air and thus the light coupling out can be improved, since the difference of the refractive indices is reduced to the material of the semiconductor chips. Thus, the encapsulation layer also serves an improved light extraction.

According to one embodiment, the structuring of the encapsulation layer in method step E) takes place by hot stamping or mechanically, for example, by sawing. This results in cavities in the encapsulation layer, wherein the cavities are delimited in particular laterally by the encapsulation layer and from below by the carrier. In particular, the side surfaces of the cavity are aligned perpendicular or nearly perpendicular to the plane of extension of the carrier. The cavities are preferably formed in the interspaces between the individual semiconductor chips. The hot stamping can be done for example with a stamp.

According to one embodiment, the method comprises a method step A): A) roughening a main surface of the carrier. In particular, the main surface of the carrier is roughened, onto which the semiconductor chips are applied in method step B). The main surface of the carrier can be roughened over the entire surface, but preferably only partially. In particular, the roughening takes place at locations of the carrier on which no semiconductor chips are applied after method step B), that is to say in the interspaces between the individual semiconductor chips, particularly preferably at the locations over which the fluoropolymer is applied directly to the carrier in method step D).

According to one embodiment, the roughening in method step A) is carried out by powder coating, etching, laser treatment or plasma treatment. The etching may be, for example, a dry etching or a wet chemical etching. The powder coating can be done for example by means of a corona charging.

According to one embodiment, the carrier comprises or consists of silicon, $Al_2O_3$ or a printed circuit board (PCB). The carrier preferably comprises or consists of silicon or $Al_2O_3$, as the thermal expansion coefficient of the material of the carrier is matched to the material of the semiconductor chips, whereby mechanical stresses can be avoided or at least greatly reduced. The printed circuit board can, for example, contain a glass fibre reinforced casting resin, such as polyethylene terephthalate.

In one embodiment, the carrier is a printed circuit board comprising a glass fibre reinforced casting resin. The roughening in method step A) can be carried out by a partial removal of the casting resin by a laser treatment in order to expose the glass fibres enclosed therein. The fluoropolymer can adhere very well to the exposed glass fibres.

According to one embodiment, by the method in method step A), anchorages are formed on the main surface of the carrier.

The anchorages may protrude 10 to 100 µm, for example, 10 to 50 µm, or 50 to 100 µm over the main surface of the carrier. The anchorages may provide improved adhesion of the encapsulation layer comprising the fluoropolymer to the carrier.

In one embodiment, the carrier is made of silicon, and in method step A), by etching the silicon and utilizing its crystal orientation, pyramidal anchorages may be formed.

According to one embodiment, the application of the metal layer takes place in method step G) by sputtering. In particular, aluminum is sputtered on.

According to one embodiment, the metal layer is formed reflecting for the primary radiation emitted by the semiconductor chips. An aluminium layer has proven to be particularly highly reflective.

According to at least one embodiment, the metal layer has a layer thickness of 10 nm to 5 µm, preferably 20 nm to woo nm, particularly preferably 50 nm to 800 nm, for example, 500 nm.

In one embodiment, the metal layer in method step G) is deposited directly on the side surfaces of the cavity, so directly on the encapsulation layer. In particular, the part of the main surface of the carrier enclosed by the cavity cannot be completely coated with the metal layer. In this embodiment, there still remains a cavity between the individual semiconductor chips.

The metal layer serves in the radiation-emitting optoelectronic device as a reflector for the primary radiation emitted by the semiconductor chips and optionally also for the secondary radiation of the wavelength conversion substance optionally contained in the encapsulation layer. As a result, the luminous efficacy and thus the efficiency of the radiation-emitting optoelectronic device can be increased.

According to one embodiment, prior to method step G, a method step G') is carried out by applying an adhesive layer into the cavities. The application of the metal layer in method step G) then preferably takes place directly on the adhesion layer. The adhesive layer may comprise or consist of an adhesive filled with silver or gold, for example, an acrylic or epoxy adhesive.

In one embodiment, the adhesion layer is deposited in method step G') directly on the side surfaces of the cavity, so directly on the encapsulation layer. In particular, the part of the main surface of the carrier enclosed by the cavity cannot be completely coated with the adhesive layer. In this embodiment, therefore, there still remains a cavity between the individual semiconductor chips.

The method is therefore particularly suitable for producing a radiation-emitting optoelectronic device with an encapsulation layer, which enables improved radiation decoupling, protects the semiconductor chip from damaging influences and is very stable to UV radiation. This is achieved by the use of fluoropolymers, which are usually very difficult to process and their use in encapsulation layers so far was not possible. By coating the encapsulation layer with a metal layer, which serves as a reflector for the radiation, in addition, the light output can be improved. Advantageously, it is no longer necessary to use separate metal frames for LEDs, which have proven to be disadvantageous due to high manufacturing costs and a limited type of processing with optical materials. The radiation-emitting optoelectronic device produced by this method is thus characterized by high stability, high efficiency and a long service life.

According to one embodiment, after method step D) and before method step E), a further method step takes place: D') applying a photoresist to the encapsulation layer, in particular to the main surface of the encapsulation layer facing away from the carrier. For example, nLof20xx from AZ/MicroChemicals can be used as photoresist. In method step E), according to this embodiment, structuring of the photoresist and of the encapsulation layer comprising the fluoropolymer takes place to form cavities in the encapsulation layer. For example, the sawing to form the cavities can be carried out by sawing through the photoresist and the encapsulation layer.

In one embodiment, method step E) may comprise a method step E1) and E2): E1) structuring of the photoresist, for example, by sawing; E2) structuring of the encapsulation layer by hot stamping or mechanically, for example, by sawing. This results in cavities in the encapsulation layer, wherein the cavities are delimited in particular laterally by the encapsulation layer and the photoresist and from below by the carrier. In particular, the side surfaces of the cavity are aligned perpendicular or nearly perpendicular to the extension plane of the carrier. The cavities are preferably formed in the interspaces between the individual semiconductor chips. The hot stamping can be done for example with a stamp.

The deposition of the metal layer in method step G) can also take place on the photoresist according to an embodiment. After method step G), a further method step takes place: H) Removing the photoresist. A metal layer deposited on the photoresist is also removed. As a result, the metal layer in method step G) can only be applied selectively in the cavity and not on the main surface of the encapsulation layer facing away from the carrier, as this is protected by the photoresist.

According to one embodiment, a further method step takes place after method step B): C) Removal of the substrates of the semiconductor chips, in particular the sapphire substrates. It is possible that, after removing the substrates, the main surface of the semiconductor chip facing away from the carrier is roughened and coated with a passivation layer. The passivation layer may comprise or consist of $SiO_2$, for example.

The method may comprise a further method step: I) applying a protective layer. In particular, this method step takes place after method step G). This method step preferably takes place after method step H).

According to one embodiment, the protective layer is deposited on the metal layer.

According to one embodiment, the protective layer comprises $SiO_2$, $Al_2O_3$, $Si_3N_4$ or parylene.

In one embodiment, after method step G) or H), a further method step takes place: J) Separating the carrier to form an electronic device comprising a semiconductor chip. The separation takes place for example by sawing. In particular, sawing takes place between two semiconductor chips and in particular between two metal layers in the cavity.

In one embodiment, after method step G) or H) or I), a further method step takes place: J) Applying a lens over the main surface of the semiconductor chip facing away from the carrier. In particular, the lens is attached over and preferably in direct contact with the encapsulation layer. The lens can be molded.

Embodiments of the invention relates to an electronic device, in particular a radiation-emitting optoelectronic device, which can be produced by the above-mentioned method. All features of the method can thus also be features of the electronic device and vice versa.

In one embodiment, the radiation-emitting optoelectronic device comprises a semiconductor chip which is designed to emit UV radiation during operation of the component. The semiconductor chip is arranged on a carrier. An encapsulation layer comprising a fluoropolymer is arranged above the main surface of the semiconductor chip facing away from the carrier and above the main surface of the carrier facing the semiconductor chip. A metal layer, in particular an aluminum layer, is arranged over the side surfaces of the semiconductor chip and over the encapsulation layer. In particular, the metal layer is in direct contact with the encapsulation layer.

BRIEF DESCRIPTION OF THE DRAWINGS

Further advantageous embodiments and developments of the invention will become apparent from the embodiments described below in connection with the figures.

Showing it:

FIG. 11 shows various fluoropolymers and their melting points;

Figure 1:
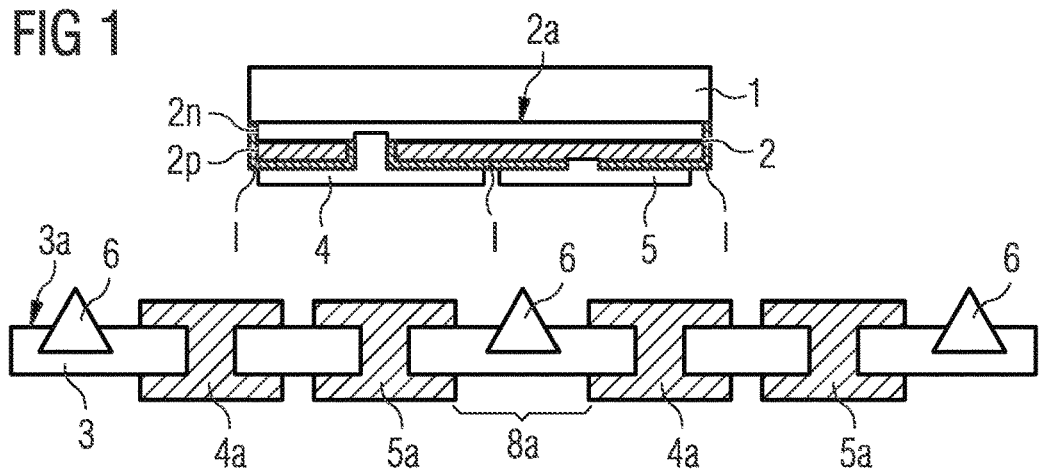
FIGS. 1 to 10 show a method for producing a radiation-emitting optoelectronic device.

In the exemplary embodiments and figures, identical, identical or identically acting elements can each be provided with the same reference numerals. The illustrated elements and their proportions with each other are not to be regarded as true to scale, but individual elements, such as layers, components, components and areas, may be oversized for better representability and/or better understanding.

DETAILED DESCRIPTION OF ILLUSTRATIVE EMBODIMENTS

FIG. 1 shows a semiconductor chip 2 comprising an active epitaxial layer sequence with an n-conducting layer 2n and a p-conducting layer 2p, which is suitable for emitting a primary radiation in the UV range of the electromagnetic spectrum during operation of the radiation-emitting optoelectronic device. The semiconductor chip 2 is arranged or grown on a substrate 1, in particular a sapphire substrate. The semiconductor chip 2 is based, for example, on aluminum indium gallium nitride. The semiconductor chip 2 is attached to a first connection 4 and a second connection 5 and is electrically contacted to these connections. In this case, the connection 4 contacts the n-conducting layer 2n and the connection 5 contacts the p-conducting layer 2p. The connection 4 and 5 are formed from a metal which has a reflectivity for UV radiation greater than 60%, preferably greater than 70%, particularly preferably greater than 80%, for example, silver or aluminum. As a result, the primary radiation emitted by the semiconductor chip can be reflected back into the semiconductor chip and emitted from the semiconductor chip via the main surface 2a. Between the p-conducting layer 2p and the connection 4 and 5, an insulating layer I is arranged. In particular, the insulating layer I isolates the first connection 4 from the p-conducting layer 2p. Between the p-conducting layer 2p and the insulating layer I, in particular, a mirror layer may be arranged above the second connection 5 (not shown here). Alternatively, the second connection 5 may have a direct contact with the p-conducting layer 2p, so it cannot be separated from it by an insulating layer. In this embodiment, the insulating layer I is located only between the first connection 4 and the p-conducting layer 2p.

Furthermore, FIG. 1 shows a schematic side view of a carrier 3. The carrier has through-connections 4a and 5a. On a main surface of the carrier 3a are anchorages 6, which are created by a roughening. The main surface of the carrier 3a is only partially roughened. In particular, the roughening takes place at locations of the main surface of the carrier 3a, on which no semiconductor chips 2 are applied in the following method step, that is to say in the interspaces 8a between the individual semiconductor chips 2. For example, the carrier 3 consists of silicon and can have pyramid-shaped anchorages 6. The pyramid-shaped anchorages 6 can be made by etching the silicon and utilizing its crystal orientation.

Figure 2:
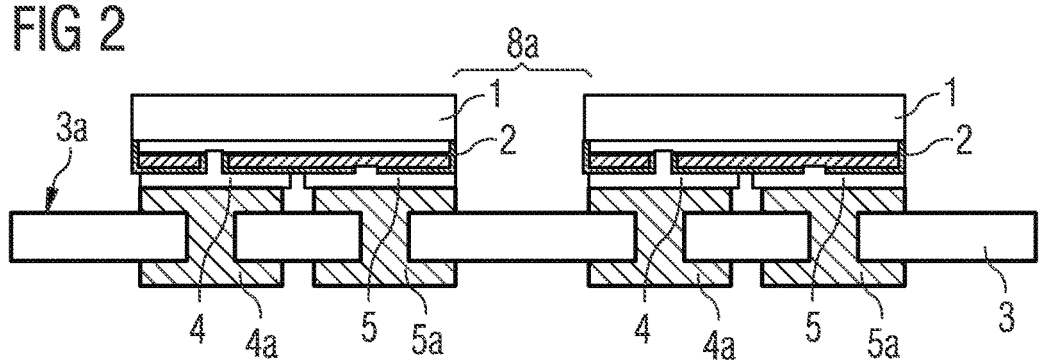

In FIG. 2, the semiconductor chips 2 are applied and fixed on the carrier 3. In each case, the connection 4 is applied to the through-connection 4a and the connection 5 to the through-connection 5a. The attachment of the semiconductor chips 2 on the main surface of the carrier 3a can be attached by gluing or soldering. The semiconductor chips 2 are arranged at a distance from one another on the carrier 3, so that an interspace 8a is formed between the individual semiconductor chips 2.

Figure 3:
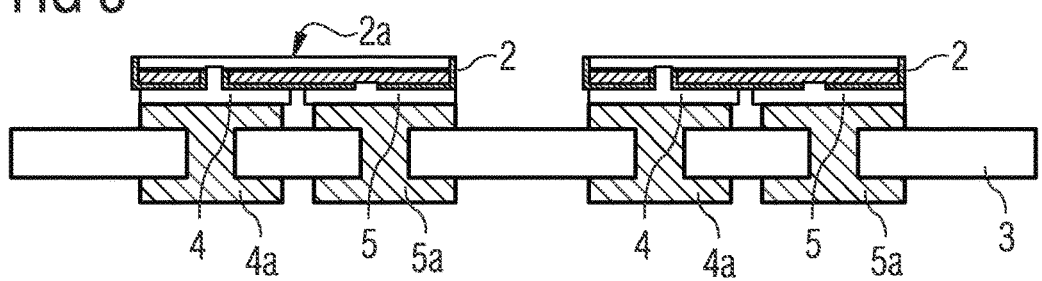

FIG. 3 shows that the substrate 1, in particular the sapphire substrate on which the epitaxial layer sequence has grown, is removed. However, it is also possible that the sapphire substrate remains partially or completely above the semiconductor chip 2. If the sapphire substrate remains partially or completely above the semiconductor chip 2, it can have topography differences at its surface, for example, about 150 µm. As a result, the subsequently applied encapsulation layer 7 can adhere very well to the surface of the sapphire substrate.

For better light extraction, the semiconductor chip 2, in particular the main surface of the semiconductor chip 2a facing away from the carrier can be roughened in order to improve the coupling out of the light to the environment, after a passivation of the semiconductor chip 2 can take place, for example, by the application of $SiO_2$ (not shown).

Figure 4:
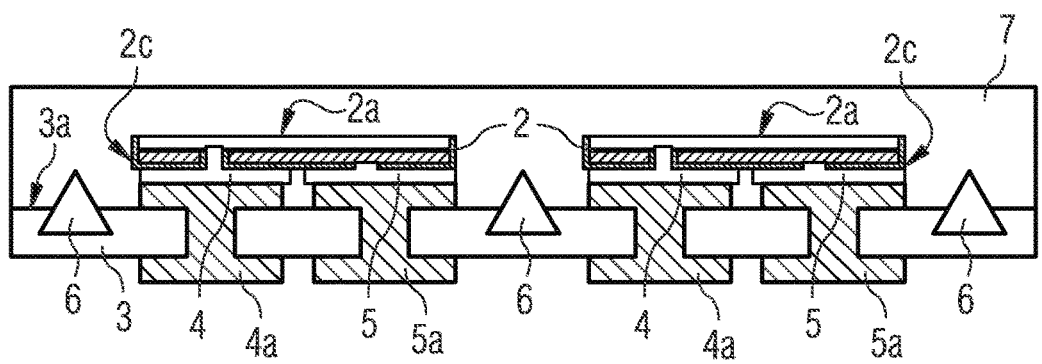

According to FIG. 4, an encapsulation layer 7 is applied over or onto the semiconductor chips 2. In particular, the encapsulation layer 7 is applied to the main surface of the carrier 3a facing the semiconductor chips, the side surfaces of the semiconductor chips 2c and to the main surfaces of the semiconductor chips 2a facing away from the carrier 3. In this case, the encapsulation layer 7 can be laminated, for example, as a film. The film comprises a fluoropolymer, for example, fluorinated ethylene-propylene copolymer (FEP). By the method according to embodiments of the invention fluoropolymers can be used in radiation-emitting optoelectronic devices, which are usually very difficult to process due to their hardness and brittleness. By the anchorages 6, the adhesion of the film on the carrier 3 is improved.

Figure 5:
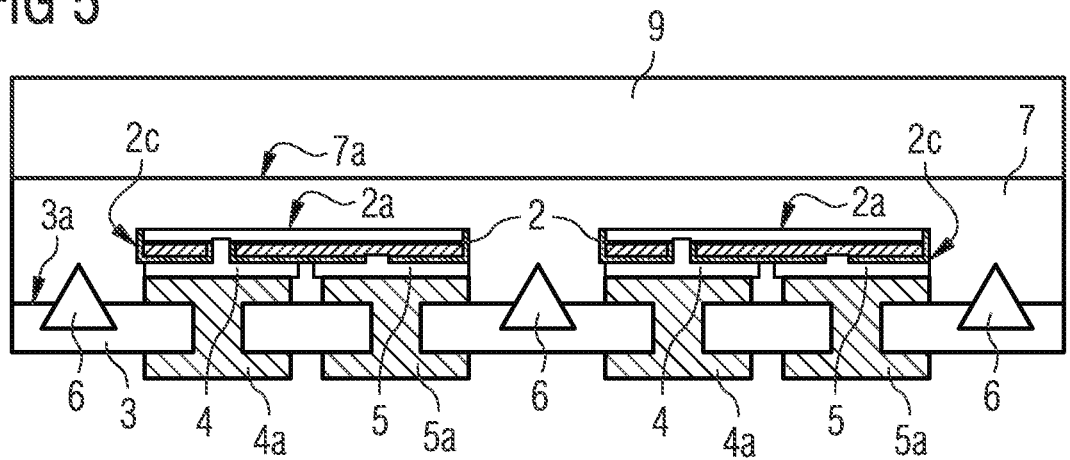

According to FIG. 5, a photoresist 9 is applied over the entire surface of the encapsulation layer 7 on the main surface of the encapsulation layer 7a facing away from the carrier 3.

Figure 6:
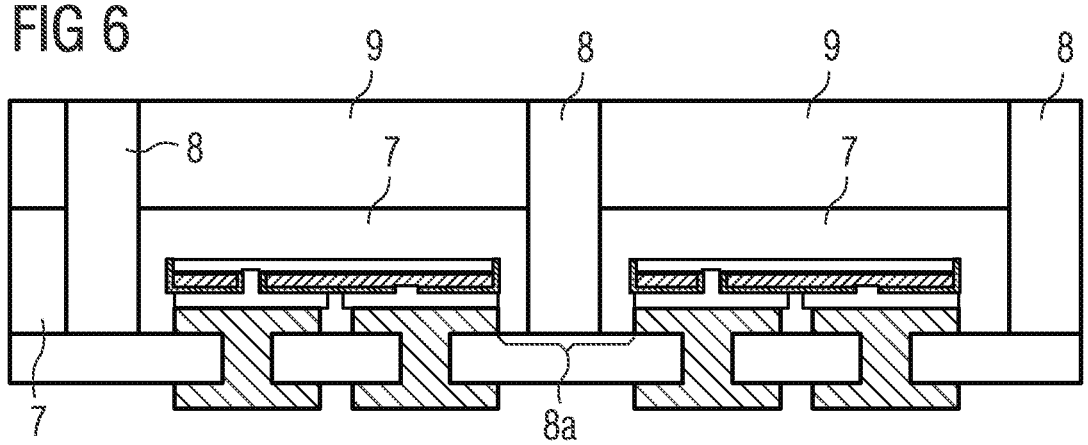

In FIG. 6, the encapsulation layer 7 and the photoresist 9 comprising the fluoropolymer are structured. In particular, this structuring takes place by sawing in each case between two semiconductor chips 2 in the interspaces 8a. The sawing can for example be done with a saw blade width of 100 to 200 µm. Cavities 8 are formed between the individual semiconductor chips 2. The cavities 8 are delimited laterally by the encapsulation layer 7 and the photoresist 9 and from below by the carrier 3. In particular, the side surfaces of the cavity 8c are aligned perpendicular or nearly perpendicular to the extension plane of the carrier 3.

Figure 7:
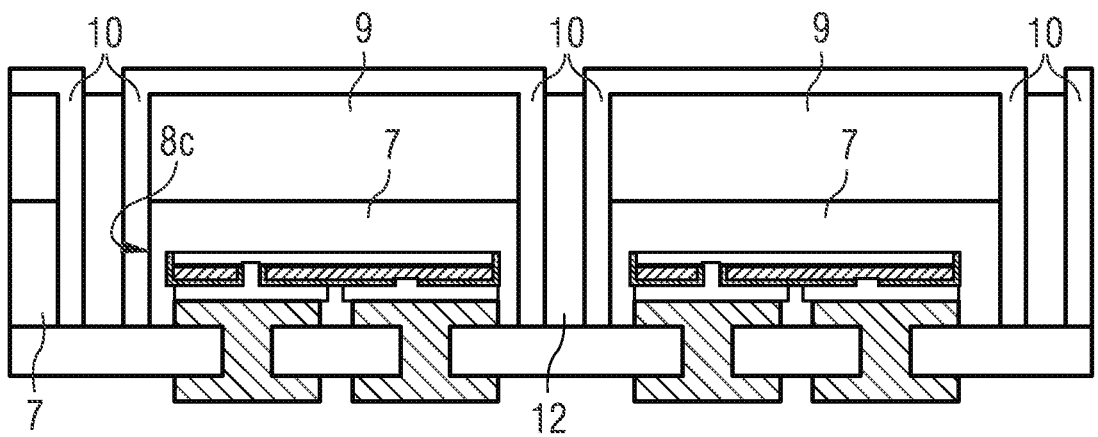

In FIG. 7, a metal layer 10 is applied in the cavity 8 and above the photoresist 9, in particular, the deposition of the metal, for example, aluminum, takes place by sputtering. In particular, the metal layer 10 is deposited on the side surfaces of the cavity 8c above the encapsulation layer 7 and the photoresist 9 and on the main surface of the photoresist 9 facing away from the carrier 3. The part of the main surface of the carrier enclosed by the cavity 8 is not completely coated with the metal layer 10. There still remains a cavity 12 between the individual semiconductor chips 2.

Figure 8:
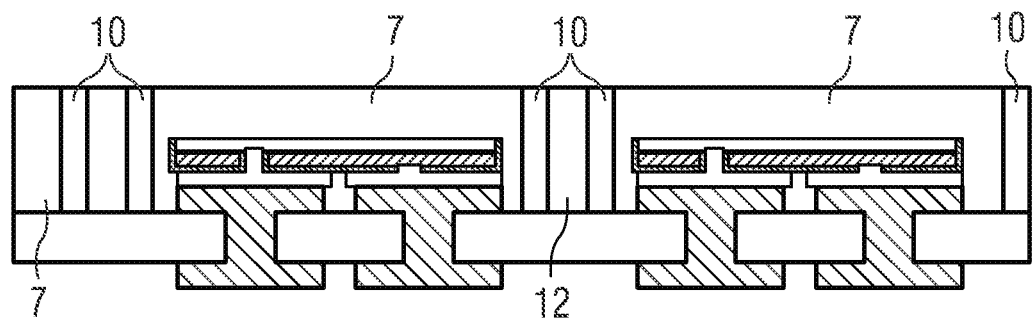

In FIG. 8, the photoresist 9 is removed. This is done for example by a lift-off method. The lift-off process dissolves the photoresist 9 under the metal layer 10 and lifts the metal layer 10 over the photoresist 9 under high pressure.

Figure 9:
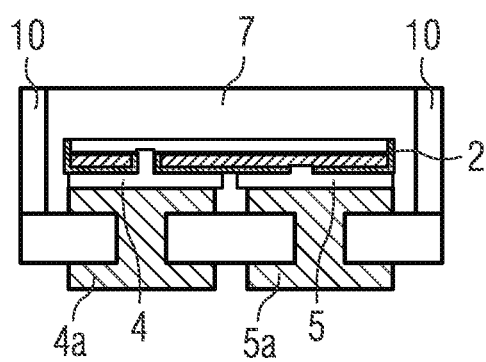

Subsequently, a separation takes place to form the radiation-emitting optoelectronic devices, which is shown in FIG. 9. The separation takes place, for example, by sawing the carrier 3 in the cavity 12.

Figure 10:
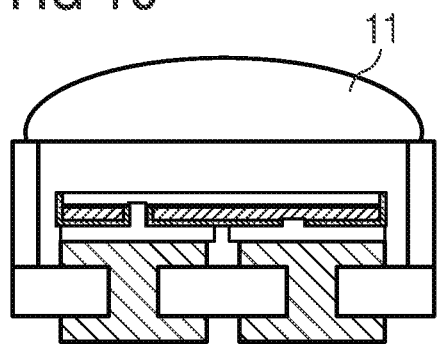

In the method step of FIG. 10, a lens ii may be applied over the encapsulation layer 7, for example, by molding. The radiation-emitting device produced in this way is a so-called "top emitter", which means that the radiation is emitted upwards to the environment via the encapsulation layer 7.

FIG. 11 shows a table with the preferred fluoropolymers of the encapsulation layer. In the first column, the respective abbreviation of the fluoropolymer, in the second column, the structural unit A, in the third column, the structural unit B, if a copolymer is involved, in the fourth column the proportion of the structural unit B in mol % and in column B indicated the melting temperature of the respective polymer. The fluoropolymers MFA, PFA-1 and FEP-1 have proven to be particularly stable to the effect of temperature and UV radiation.

Figure 12:
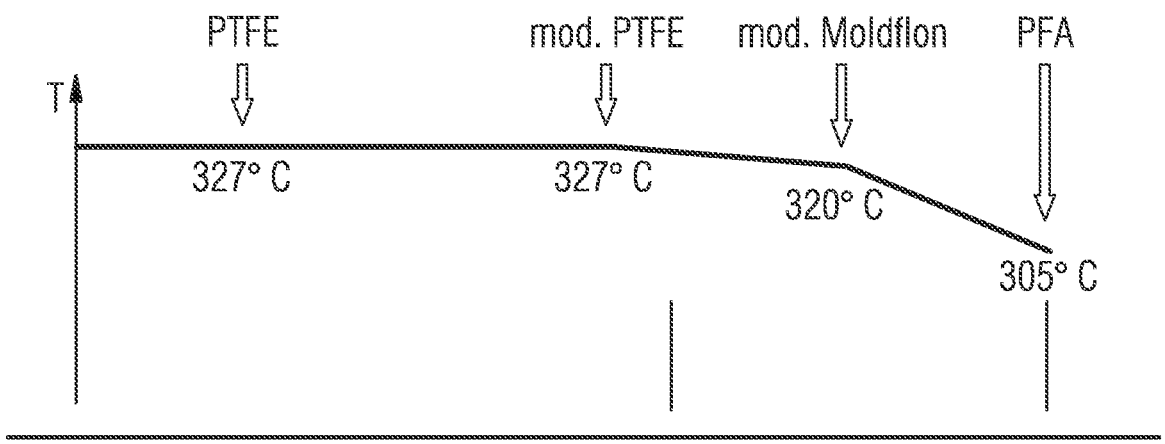
FIG. 12 shows melting temperatures for different fluoropolymers.

FIG. 12 shows melting temperatures for different fluoropolymers. At melting temperatures below 320° C., the fluoropolymers can be applied by injection molding, injection compression molding or transfer molding. If the melting temperatures are higher, the fluoropolymers can be processed into a film that can be laminated or applied and fastened by hot stamping or welding. At melting temperatures above 320° C., the fluoropolymers can be subjected to a sintering process. For this purpose, individual powder particles are sintered together to form a homogeneous structure. At temperatures above 350° C. the crystallization melting point is exceeded and the PTFE enters the amorphous state, here as "mod. PTFE". At a melting temperature of 305° C., the PFA can be melted. At a temperature of 320° C., the so-called Moldflon can be melted. At a temperature of 327° C., the mod. PTFE, the polytetrafluoroethylene, are melted. At 327° C., the PTFE can be melted. The PTFE is not moldable by nature. For example, it can only be injection-molded by side chain modification, for example, Moldflon. The Moldflon is a fluoropolymer available from Elring Klinger Kunststofftechnik.

Figure 13:
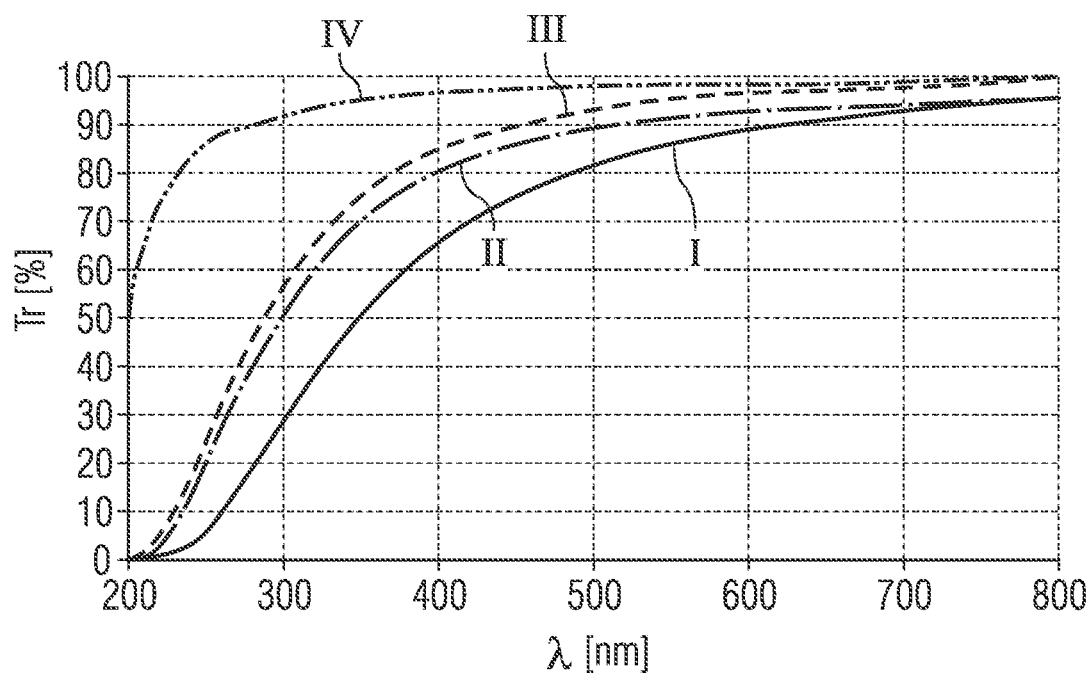
FIG. 13 shows a transmission of different fluoropolymers.

FIG. 13 shows the relative transmission Tr in percent of different fluoropolymers at different wavelengths λ in nm. The data are based on measurements of an encapsulation layer consisting of the respective fluoropolymer with a layer thickness of 0.5 mm in each case. The curve provided with the reference numeral I shows the transmission of Hyflon® PFA, the curve provided with the reference numeral II shows the transmission of Hyflon® PFA M640, the curve provided with the reference numeral III shows the transmission of Hyflon® MFA F1540 and with the reference numeral IV curve shows the transmission of a fluoropolymer consisting of a combination of PFA-1 and MFA.

The embodiments described in connection with the figures and their features can also be combined with each other according to further embodiments, even if such combinations are not explicitly shown in the figures. Furthermore, the embodiments described in connection with the figures may have additional or alternative features according to the description in the general part.

The invention is not limited by the description based on the embodiments of these, but the invention includes any novel feature as well as any combination of features, which in particular includes any combination of features in the patent claims, even if this feature or this combination itself is not explicitly stated in the patent claims or exemplary embodiments.

The invention claimed is:

1. A method for producing an electronic device, the method comprising:
    attaching semiconductor chips on a carrier;
    applying a fluoropolymer to main surfaces of the semiconductor chips facing away from the carrier and a main surface of the carrier facing the semiconductor chips thereby forming an encapsulation layer comprising the fluoropolymer;
    structuring the encapsulation layer thereby forming cavities in the encapsulation layer, wherein the cavities are laterally delimited by the encapsulation layer and delimited from below by the carrier; and
    applying a metal layer in the cavities.

2. The method according to claim 1, wherein the method produces a radiation-emitting optoelectronic device, and wherein a semiconductor chip is adapted to emit UV radiation during operation.

3. The method according to claim 1,
    wherein the fluoropolymer comprises a first structural unit A of the following general formula:

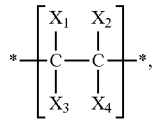

wherein the substituents $X_1$ to $X_4$ are each independently selected from the group consisting of hydrogen, halogens, R and OR,
    wherein R is in each case a hydrocarbon residue $C_1$-$C_{10}$ or a fluorinated hydrocarbon residue $C_1$-$C_{10}$, and
    wherein at least one of the substituents $X_1$ to $X_4$ is fluorine.

4. The method according to claim 3,
    wherein the fluoropolymer is a copolymer comprising, in addition to the first structural unit A, at least one further structural unit B, different from the first structural unit A, of the following general formula:

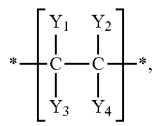

wherein the substituents $Y_1$ to $Y_4$ are each independently selected from the group consisting of hydrogen, halogens, R and OR, and
    wherein each R is a hydrocarbon residue $C_1$-$C_{10}$ or a fluorinated hydrocarbon residue $C_1$-$C_{10}$.

5. The method according to claim 3,
    wherein the fluoropolymer is a copolymer comprising, in addition to the first structural unit A, at least one further structural unit B, different from the first structural unit A, of the following general formula:

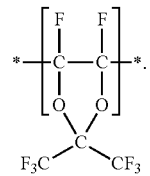

6. The method according to claim 1,
    wherein the fluoropolymer is a copolymer having a first structural unit A and a second structural unit B,
    wherein the first structural unit A is selected from the group consisting of:

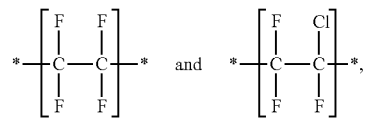

wherein the second structural unit B is selected from the group consisting of:

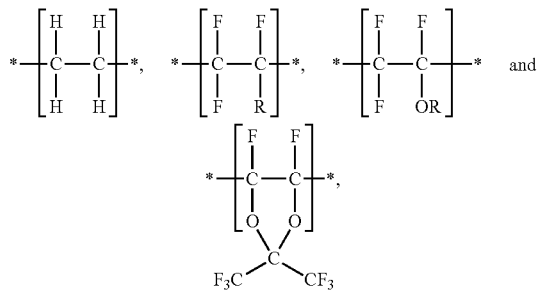

and
    wherein each R is a hydrocarbon residue $C_1$-$C_{10}$ or a fluorinated hydrocarbon residue $C_1$-$C_{10}$.

7. The method according to claim 1, wherein the fluoropolymer is a polymer selected from the group consisting of Ethylene chlorotrifluoroethylene copolymer (ECTFE), Ethylene tetrafluoroethylene copolymer (ETFE), Perfluoroalkoxy polymers (PFA), Fluorinated ethylene-propylene copolymer (FEP), Polyvinyl fluoride (PVF), Polychlorotrifluoroethylene (PCTFE), Copolymer of tetrafluoroethylene, hexafluoropropylene and vinylidene fluoride (THV), Copolymer of tetrafluoroethylene and 2,2 bis(trifluoromethyl)-4,5-difluoro-1,3-dioxolane (PTFE-AF), Polytetrafluoroethylene (PTFE), and Polyvinylidene fluoride (PVDF).

8. The method according to claim 1, wherein applying the fluoropolymer comprises applying a film including the fluoropolymer by hot stamping or lamination.

9. The method according to claim 1, wherein applying the fluoropolymer comprises applying the fluoropolymer by injection molding, injection compression molding, transfer molding, hot stamping or welding.

10. The method according to claim 1, wherein structuring the encapsulation layer comprises structuring the encapsulation layer by hot stamping or by sawing.

11. The method according to claim 1, further comprising roughening the carrier.

12. The method according to claim 11, wherein roughening the carrier comprise roughening the carrier by powder coating, etching or a plasma treatment.

13. The method according to claim 12, roughening the carrier comprises forming anchorages on the main surface of the carrier.

14. The method according to claim 13, wherein the anchorages protrude 10 to 100 μm above the main surface of the carrier.

15. The method according to claim 1, wherein applying the metal layer comprises applying the metal layer by sputtering.

16. A radiation-emitting optoelectronic device comprising:
- a semiconductor chip arranged on a carrier, the semiconductor chip configured to emit UV radiation during operation;
- an encapsulation layer comprising a fluoropolymer arranged above a main surface of the semiconductor chip facing away from the carrier and above a main surface of the carrier facing the semiconductor chip; and
- a metal layer disposed above side surfaces of the semiconductor chip and above and in direct contact with the encapsulation layer, the fluoropolymer being selected from:

MFA with a first structural unit A

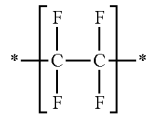

and with a second structural unit B

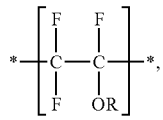

wherein R is $CF_3$, and wherein a proportion of the second structural unit B in a copolymer is 3-4 mol %;

PFA-1 with the first structural unit A

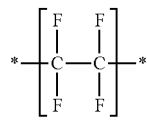

and with the second structural unit B

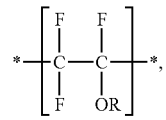

wherein R is $CF_2CF_2CF_3$, and wherein a proportion of the second structural unit B in the copolymer is 1.5-2 mol %;

a combination of the MFA and the PFA; or

FEP-1 with a first structural unit A

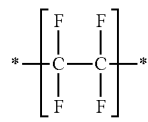

and with a second structural unit B

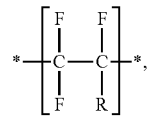

wherein R is $CF_3$, and wherein a proportion of the second structural unit B in the copolymer is 7-7.5 mol %.

17. A method for producing an electronic device the method comprising:
- attaching semiconductor chips on a carrier;
- applying a fluoropolymer to main surfaces of the semiconductor chips facing away from the carrier and a main surface of the carrier facing the semiconductor chip thereby forming an encapsulation layer comprising the fluoropolymer;
- structuring the encapsulation layer comprising the fluoropolymer thereby forming cavities in the encapsulation layer, wherein the cavities are laterally delimited by the encapsulation layer and delimited from below by the carrier, and wherein the cavities are formed in interspaces between the individual semiconductor chips; and
- applying a metal layer in the cavities.

* * * * *